United States Patent [19]

Crivello

[11] 4,264,703

[45] * Apr. 28, 1981

[54] CATIONICALLY POLYMERIZABLE COMPOSITIONS CONTAINING PHOTODECOMPOSABLE AROMATIC IODONIUM SALTS

[75] Inventor: James V. Crivello, Elnora, N.Y.

[73] Assignee: General Electric Company, Schenectady, N.Y.

[*] Notice: The portion of the term of this patent subsequent to Nov. 15, 1994, has been disclaimed.

[21] Appl. No.: 638,992

[22] Filed: Dec. 9, 1975

Related U.S. Application Data

[63] Continuation of Ser. No. 466,377, May 2, 1974, abandoned.

[51] Int. Cl.$^3$ .............................................. G03C 1/68
[52] U.S. Cl. ........................... 430/270; 204/159.18; 204/159.23; 430/281; 430/286; 430/914
[58] Field of Search .................... 96/115 P, 115 R; 204/159.18, 159.25, 159.24; 430/914, 270, 281, 286

[56] References Cited

U.S. PATENT DOCUMENTS

| | | | |
|---|---|---|---|
| 3,495,987 | 2/1970 | Moore | 96/115 P |
| 3,567,453 | 3/1971 | Borden | 96/115 R |
| 3,579,339 | 5/1971 | Chang et al. | 96/115 P |
| 3,729,313 | 4/1973 | Smith | 96/27 R |
| 3,785,821 | 1/1974 | Notley | 96/115 R |

OTHER PUBLICATIONS

Kunieda et al., Polymer Letters Edition, vol. 12, pp. 395-397 (1974).
Foster et al., Tetrahedron Letters, No. 47, pp. 4793-4794 (1972).
Irving et al., J. Chem. Soc. (1960) pp. 2078-2081.
Banks, Chemical Reviews, vol. 66, No. 3 (1966), pp. 243-266.
Schonberg, Preparative Organic Photochemistry (1968) pp. 455-458.

*Primary Examiner*—Jack P. Brammer
*Attorney, Agent, or Firm*—William A. Teoli; James C. Davis, Jr.

[57] ABSTRACT

Cationic polymerization of a variety of organic materials such as vinyl monomers, prepolymers, cyclic ethers, cyclic esters and organosilicon cyclics can be achieved by the use of certain radiation sensitive aromatic halonium salts. In addition, polymerizable compositions are provided which can be used as coating compounds, molding resins, adhesives, etc.

9 Claims, No Drawings

CATIONICALLY POLYMERIZABLE COMPOSITIONS CONTAINING PHOTODECOMPOSABLE AROMATIC IODONIUM SALTS

This is a continuation, of application Ser. No. 466,377, filed May 2, 1974 now abandoned.

Prior to the present invention, it was generally known that a variety of organic materials such as vinyl monomers possessing a high electron density in the double bond, were subject to cationic polymerization. A small amount of a Lewis Acid catalyst, such as $SnCl_4$, $SbF_5$, $AsF_5$, etc. readily polymerizes vinyl monomers such as styrene, butadiene, vinyl alkyl ethers, etc. It is often difficult, however, to generate the Lewis Acid catalyst at the appropriate time for polymerization, or have it properly dispersed throughout the vinyl monomer to achieve uniform results.

Additional organic materials such as aldehydes, cyclic ethers and cyclic esters also can undergo cationic polymerization in the presence of trace amounts of Lewis Acids. Such materials when catalyzed, can be employed in coating applications, as encapsulants, and for a variety of thermoplastic applications. However, optimum results cannot be achieved because it is difficult to achieve dispersion or generation of the Lewis Acid in a desirable manner. A further description of the principles by which cationic polymerization of the above described organic materials can be achieved with Lewis Acids is described in *Principles of Polymer Chemistry*, pp 217–222 by P. J. Flory, Cornell University Press, Ithica, New York (1953), and *Polymer Reviews* by J. Furukawa and T. Saegusa, Interscience Publishers, New York (1953). Another class of materials which undergoes cationic polymerization in the presence of Lewis Acids is organosilicon cyclics as shown by W. Noll, *The Chemistry and Technology of Silicones*, pp 219–226, Academic Press, New York (1968).

Improved methods of generating the Lewis Acids to effect polymerization of organic materials can be achieved by using heat-sensitive Lewis Acid-tertiary amine complexes, such as complexes of boron trifluoride with tertiary amines. Although improved pot life can be obtained by such tertiary amine complexes, elevated temperatures such as up to 150° C. and substantially long cure times render such methods unsuitable for continuous cures or for the manufacture of delicate electronic devices. In addition, volatile monomers cannot be used. Schlesinger U.S. Pat. No. 3,708,296 or Watt U.S. Pat. No. 3,794,576 describe methods of releasing Lewis Acid catalysts by the use of ultraviolet radiation sensitive aromatic diazonium salts. Although actinic irradiation substantially minimizes the disadvantages of the heat cure, the not life of the polymerizable mixture during the shelf period is often unsatisfactory. As a result, a stabilizer must be used to prolong the shelf period of the polymerizable mixture. Nitrogen is also generated during cure which can render the resulting product unsuitable in a variety of applications.

The present invention is based on the discovery that certain photosensitive aromatic halonium salts, as illustrated by the formula,

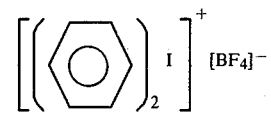

can be a source of Lewis Acids such as boron trifluoride, phosphorous pentafluoride, arsenic pentafluoride, etc., when exposed to radiant energy. A variety of radiation polymerizable compositions are provided by incorporating the photosensitive aromatic halonium salt into a cationically polymerizable organic material. Unlike polymerizable compositions containing the above described diazonium salts, the compositions of the present invention, which can be in the form of a solid or liquid, do not require a stabilizer. Even after extended shelf periods, the polymerizable compositions of the present invention do not exhibit any significant change in properties. In addition, there is no problem with bubbling as characterized by organic resin compositions containing diazonium salts.

The polymerizable compositions of the present invention can be used as molding and extrusion resins, adhesives, caulks, coatings, printing inks, impregnated tapes, insulation, sealants, blood plasma extenders, lubricants, etc.

The aromatic halonium salts utilized in the compositions of the present invention can be more particularly defined by the following formula, $$[(R)_a(R^1)_b X]^+{}_c [MQ_d]^{-(d-e)} \quad (I)$$

where R is a monovalent aromatic organic radical, $R^1$ is a divalent aromatic organic radical, X is a halogen cation, M is a metal or metalloid atom, Q is a halogen atom, such as Cl, F, Br, I, etc., a is a whole number equal to 0 to 2, b is a whole number equal to 0 or 1, and the sum of a+b is equal to 2 or the valence of X, c = d − e e = valence of M and is an integer equal to 2 to 7 inclusive, d is an integer having a value greater than e.

Radicals included by R can be the same or different, aromatic carbocyclic or heterocyclic radical having from 6 to 20 carbon atoms, which can be substituted with from 1 to 4 monovalent radicals selected from $C_{(1-8)}$ alkoxy, $C_{(1-8)}$ alkyl, nitro, chloro, etc., R is more particularly, phenyl, chlorophenyl, nitrophenyl, methoxyphenyl, pyridyl, etc. Radicals included by $R^1$ are divalent radicals such as

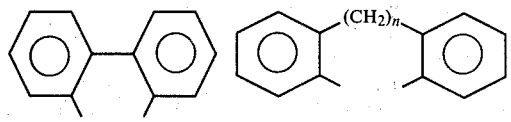

Complex anions included by $MQ_e{}^{-(d-e)}$ of formula I are, for example, $BF_4^-$, $PF_6^-$, $AsF_6^-$, $SbF_6^-$, $FeCl_4^=$, $SnCl_6^-$, $SbCl_6^-$, $BiCl_5^{--}$, $AlF_6^{-3}$, $GaCl_4^-$, $InF_4^-$, $TiF_6^{--}$, $ZrF_6^-$, etc. Metal or metalloids included by M of formula I are transition metals such as Sb, Fe, Sn, Bi, Al, Ga, In, Ti, Zr, Sc, V, Cr, Mn, Cs, rare earth elements such as the lanthanides, for example, Cd, Pr, Nd, etc. actinides such as Th, Pa, U, Np, etc. and metalloids such as B, P, As, etc.

Halonium salts included by formula I are, for example,

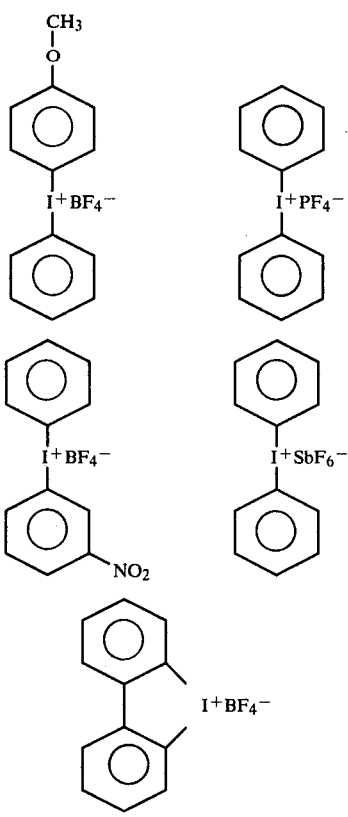

There is provided by the present invention, polymerizable compositions comprising, (A) a monomeric or prepolymeric cationically polymerizable organic material free of oxirane oxygen selected from vinyl organic monomers, vinyl organic prepolymers, cyclic organic ethers, cyclic organic esters, cyclic organic sulfides and organosilicon cyclics, and (B) an effective amount of a radiation sensitive aromatic halonium salt capable of effecting the polymerization of (A) by release of a Lewis Acid catalyst when exposed to radiant energy.

The halonium salts of formula I are well known and can be made by the procedures described by O. A. Ptitsyna, M. E. Pudecva, et al, Dokl, Adad Nauk, SSSR, 163, 383 (1965); Dokl, Chem., 163, 671 (1965). F. Marshall Beringer, M. Drexler, E. M. Gindler, J. Am. Chem. Soc., 75, 2705 (1953). J. Collette, D. McGreer, R. Crawford, et al, J. Am. Chem. Soc. 78, 3819 (1956).

Included by the vinyl organic monomers which can be used in the practice of the invention to make polymerizable compositions which are convertible to thermoplastic polymers are, for example, styrene, vinyl acetamide, α-methyl styrene, isobutyl vinylether, n-octyl vinylether, acrolein, 1,1-diphenylethylene, β-pinene; vinyl arenes such as 4-vinyl biphenyl, 1-vinyl pyrene, 2-vinyl fluorene, acenaphthylene, 1 and 2-vinyl naphthylene; 9-vinyl carbazole, vinyl pyrrolidone, 3-methyl-1-butene; vinyl cycloaliphatics such as vinylcyclohexane, vinylcyclopropane, 1-phenylvinylcyclopropane; dienes such as isobutylene, isoprene, butadiene, 1,4-pentadiene, etc.

Some of the vinyl organic prepolymers which can be used to make the polymerizable compositions of the present invention are, for example, $CH_2=CH-O-(CH_2-CH_2O)_n-CH=CH_2$, where n is a positive integer having a value up to about 1000 or higher; multi-functional vinylethers, such as 1,2,3-propane trivinyl ether, trimethylolpropane trivinyl ether, prepolymers having the formula,

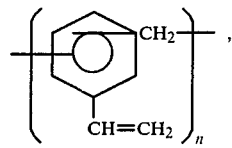

and low molecular weight polybutadiene having a viscosity of from 200 to 10,000 centipoises at 25° C., etc. Products resulting from the cure of such compositions can be used as potting resins, crosslinked coatings, printing inks and other applications typical of thermosetting or network resins.

A further category of the organic materials which can be used to make the polymerizable compositions are cyclic ethers which are convertible to thermoplastics. Included by such cyclic ethers are, for example, oxetanes such as 3,3-bischloromethyloxetane alkoxyoxetanes as shown by Schroeter U.S. Pat. No. 3,673,216, assigned to the same assignee as the present invention; oxolanes such as tetrahydrofuran, oxepanes, oxygen containing spiro compounds, trioxane, dioxolane, etc.

In addition to cyclic ethers, there are also included cyclic esters such as β-lactones, for example, propiolactone, cyclic amines, such as 1,3,3-trimethylazetidine and organosilicone cyclics, for example, materials included by the

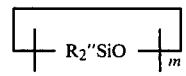

where R″ can be the same or different monovalent organic radicals such as methyl or phenyl and m is an integer equal to 3 to 8 inclusive. An example of an organosilicon cyclic is hexamethyl trisiloxane, octamethyl tetrasiloxane, etc. The products made in accordance with the present invention are high molecular weight oils and gums.

In particular instances, depending upon the compatibility of the halonium salt with the organic material, the halonium salt can be dissolved or dispersed in an organic solvent such as nitromethane, acetonitrile, methylene chloride, etc., prior to its incorporation into the organic material. Experience has shown that the proportion of halonium salt to organic material can vary widely inasmuch as the salt is substantially inert, unless activated. Effective results can be achieved, for example, if a proportion of from 0.1% to 15% by weight of halonium salt is employed, based on the weight of polymerizable composition. Higher or lower amounts can be used, however, depending upon factors such as the nature of organic material, intensity of radiation, polymerization time desired, etc.

It has been found that the halonium salt of formula I also can be generated in situ in the presence of the organic material if desired. For example, an onium salt of the formula, $$[(R)_a(R^1)_b X]^+[Y]^-,$$

where R, $R^1$, X, a and b are as previously defined, and Y is an anion such as $Cl^-$, $Br^-$, $I^-$, $F^-$, $HSO_4^-$ and $NO_3^-$, etc. can be separately or simultaneously introduced into the organic material with a Lewis Acid of the formula, $$M'(MQ)$$

where M and Q are as previously defined and M' is a metal such as an alkali metal, for example, $Na^+$, $K^+$, etc., alkaline earth, such as $Ca^{++}$, $Mg^{++}$ and organic cations such as quarternary ammonium, pyridinium, etc.

The polymerizable compositions may contain inactive ingredients such as silica fillers, dyes, extenders, viscosity control agents, process aids, etc. in amounts up to 100 parts filler per 100 parts of organic material.

Polymerization can be achieved by activating the halonium salt to provide the release of the Lewis Acid catalyst. Activation of the halonium salt can be achieved by heating the composition at a temperature in the range of from 150° C. to 250° C. Preferably, polymerization can be achieved by exposing the composition to radiant energy such as electron beam or ultraviolet light. Electron beam cure can be effected at an accelerator voltage of from about 100 to 1000 KV. Polymerization is preferably achieved by the use of UV irradiation having a wavelength of from 1849 Å to 4000 Å. The lamp systems used to generate such radiation can consist of ultraviolet lamps such as from 1 to 50 discharge lamps, for example, xenon, metallic halide, metallic arc, such as a low, medium or high pressure mercury vapor discharge lamp, etc. having an operating pressure of from a few millimeters to about 10 atmospheres, etc., can be employed. The lamps can include envelopes capable of transmitting light of a wavelength preferably of 2400 Å to 4000 Å. The lamp envelope can consist of quartz, such as Spectrocil or Pyrex, etc. Typical lamps which can be employed for providing ultraviolet radiation are, for example, medium pressure mercury arcs, such as the GE H3T7 arc and the Hanovia 450 W arc lamp. Polymerization may be carried out with a combination of various lamps, some or all of which can operate in an inert atmosphere. When using UV lamps, the irradiation flux in the substrate can be at least 0.01 watts per square inch to effect polymerization of the organic material within 1 to 20 seconds and permit the cure to be carried on continuously as, for example, in the curing of a multifunctional vinyl ether-coated steel strip, or paper web, to be taken up at a rate of from 100 to 600 feet per minute. The web can be cut to a predetermined width for use as printed material. A combination of heat and light may be used to cure reactive compositions. Such a combination of heat and light may serve to reduce the overall cure time.

In order that those skilled in the art will be better able to practice the invention, the following examples are given by way of illustration and not by way of limitation. All parts are by weight.

EXAMPLE 1

A curable mixture was prepared by adding under a nitrogen atmosphere 0.2 part of diphenyliodonium hexafluorophosphate to 39 parts of tetrahydrofuran. The resulting mixture was exposed for 10 minutes to ultraviolet light from a GE H3T7 lamp. The resulting product was allowed to stand for 3 hours. A highly viscous product was obtained. The polymer was then poured into water to destroy the catalyst and then was filtered off and dissolved in tetrahydrofuran. On pouring the highly viscous polymer into methanol, a fibrous, tough polymer was obtained. The polymer was washed with methanol and dryed to give a pale yellow material having an intrinsic viscosity of 3.9 dl/g. This indicates a molecular weight of greater than 350,000. The polymer was pressed into an exceedingly tough film. It could be heat-pressed to a particular shape.

The procedure is repeated except a portion of the mixture is allowed to remain under normal daylight conditions for several days at ambient temperature. No change in viscosity is noted.

EXAMPLE 2

A mixture of 0.1 part of diphenyliodonium fluoroborate and a solution of 13.3 parts of N-vinylcarbazole in 39.9 parts of methylene chloride was irradiated for 10 min. at a distance of 3 inches from a 450 W Hanovia lamp. Irradiation was performed under nitrogen while the mixture was in a vial. There was observed rapid exothermic polymerization of the monomer to give a viscous polymer. After standing in the dark for 3 hours, the polymer was isolated by pouring it into methanol. There was obtained after filtering, washing and drying 13.1 parts of a dry, powdery polymer. Based on method of preparation, the polymer was polyvinylcarbazole useful as a molding compound.

EXAMPLE 3

Three parts of p-methoxydiphenyliodonium fluoroborate were added to 97 parts diethyleneglycol divinyl ether. This blend was thoroughly mixed by stirring for one hour. Then the sensitized mixture was applied to a glass plate as a 1 mil coating. Exposure of this composition to ultraviolet light from an H3T7 lamp at a distance of four inches for 2-3 seconds in air gave a completely cured, hard coating which could not be removed by rubbing with acetone.

A portion of the above sensitized mixture was combined with 2 parts by weight Cabosil M-5 silica filler and knife coated to provide a 2 mil coating. The film was cured as before and required 3 seconds irradiation to be converted to a hard translucent coating.

EXAMPLE 4

A mixture of 0.32 part of diphenyliodonium chloride, 10 parts of ethylene glycol divinyl ether and 0.21 part of $NaAsF_6$ was heated under sealed conditions for 5 hours at 50° C. All suspended salts were then allowed to settle and the clear solution was knife coated onto a 3 in × 6 in steel panel to provide a 0.2 mil coating. Cure was performed as in Example 3. Three seconds were required to give a highly cured, acetone resistant coating.

EXAMPLE 5

There were added 0.3 part di-p-tolyliodonium fluoroborate and 0.4 part carbon black to 15 parts trimethylolpropane trivinyl ether. The mixture was agitated for 3 hours in a ball mill and then applied to white print paper. Exposure of the treated paper to ultraviolet light from an H3T7 lamp at a distance of 3 inches cured the ink in 1-2 seconds.

EXAMPLE 6

There was added 0.1 part of p-methoxyphenylphenyliodonium hexafluorophosphate to a mixture of 6 parts hexamethylcyclotrisiloxane and 4 parts octamethyltetrasiloxane. The mixture of monomers and sensitizer was sealed under nitrogen. The mixture was then placed 3 inches from a Hanovia 450 watt lamp and irradiated for 10 minutes to activate the catalyst. After allowing the mixture to stand for 16 hours during which the contents became very viscous, the product was poured into methanol. Based on method of preparation, the product was a polydimethyl siloxane oil. It was recovered by decanting the methanol layer, washing with more methanol and then drying in vacuo at 60° C. The polydimethyl siloxane oil was useful for imparting improved surface characteristics to fibrous substrates.

EXAMPLE 7

A mixture was prepared composed of 2% diphenyliodonium tetrafluoroborate, 97.5% ethyleneglycol divinyl ether and 0.5% of a surface active agent. The mixture was stirred until homogeneous and then coated onto a 3 in×6 in steel panel using a 0.2 mil drawblade. After exposing the panel for a period of 1 second to ultraviolet radiation, the film became hard. The film could not be removed by rubbing with acetone nor was it affected by imersion in boiling water for one hour.

EXAMPLE 8

A mixture of 0.26 part of 4-methoxydiphenyliodonium fluoroborate, 28.8 parts of freshly distilled styrene and 13 parts of methylene chloride was flushed with nitrogen and sealed. The mixture was exposed six minutes to a 450 watt Hanovia lamp. Rapid polymerization took place and the polymerization product was allowed to stand in the dark for 2 hours. A highly viscous reaction product was obtained which was poured into methanol and the solid product was filtered and washed. The product was dried in a vacuum oven. There was obtained 25.7 g of product. Based on method of preparation, the product was polystyrene.

EXAMPLE 9

A mixture of 22.8 parts of recrystallized acenaphthalene, 0.23 part of 4-methoxydiphenyliodonium fluoroborate and 58.6 parts of methylene chloride was purged with nitrogen and sealed. It was then irradiated for 8 hours in accordance with Example 8. A powdery tan precipitate of polyacenaphthalene was obtained on pouring the solution into methanol. After drying overnight in a vacuum oven at 60° C., there was obtained 22.2 parts of polymer.

EXAMPLE 10

A mixture of 11.4 parts of α-methylstyrene, 0.11 part of 4-methoxydiphenyliodonium fluoroborate and 13 parts of methylene chloride was flushed with nitrogen and sealed. While using a methanol dry ice bath, the mixture was irradiated as in Example 8. The resulting highly viscous polymer solution was quenched by adding a small amount of methanol and the polymer isolated by pouring the solution into a large amount of methanol. After drying, 11 parts of poly-α-methylstyrene were obtained.

EXAMPLE 11

A solution of diethyleneglycol divinyl ether containing 2% by weight 4-methoxydiphenyliodonium fluoroborate was coated onto a 3 in×6 in steel plate. A perforated mask was placed over the coating and this assembly was exposed to ultraviolet light using a GE H3T7 medium pressure mercury arc lamp at a distance of four inches. After a 5 second exposure, the mask was removed and the plate was washed with i-propanol. A clear, raised negative image of the mask was formed. These results showed that this photo-imaging procedure was useful in printing plate applications and in printed circuits for semiconductor devices.

Although the above examples are limited to only a few of the very many polymerizable compositions and uses thereof which are included within the scope of the present invention, it should be understood that the present invention is intended to cover a much broader class of polymerizable compositions such as a mixture of the halonium salt and a cyclic organic sulfide and uses thereof. Those skilled in the art would also know that the polymerizable compositions also cover the use of onium polymers containing halonium functionality as part of the polymer backbone or in a pendant position.

What I claim as new and desire to secure by Letters Patent of the United States is:

1. Cationically polymerizable compositions consisting essentially of
   (A) a monomeric or prepolymeric cationically polymerizable organic material free of oxirane oxygen selected from vinyl organic monomers, vinyl organic prepolymers, cyclic organic ethers, cyclic organic esters, cyclic organic sulfides, cyclic amines and organosilicon cyclics, and
   (B) an effective amount of photodecomposable aromatic iodonium salt capable of effecting the polymerization of (A) when exposed to radiant energy where said photodecomposable aromatic iodonium salt has the formula, $$[(R)_a(R^1)_bX]_c^+[MQ_d]^{-(d-e)}$$

where R is a monovalent aromatic organic radical, $R^1$ is a divalent aromatic organic radical, X is a halogen cation, M is a metal or metalloid atom, Q is a halogen atom, a is a whole number equal to 0 to 2, b is a whole number equal to 0 or 1, and the sum of a +b is equal to 2 or the valence of X, c = d − e e = valence of M and is an integer equal to 2–7 inclusive, d is an integer having a value greater than 3.

2. A composition in accordance with claim 1, wherein the organic material is a vinyl organic monomer.

3. A polymerizable composition in accordance with claim 1, where the organic material is a vinyl organic prepolymer.

4. A curable composition in accordance with claim 1, where the organic material is a cyclic organic ether.

5. A curable composition in accordance with claim 3, where the organic material is a polyvinyl organic ether.

6. A curable composition in accordance with claim 1, where the organic material is a cyclic organic ester.

7. A curable composition in accordance with claim 1, where the organic material is a cyclic organosilicon compound.

8. A curable composition in accordance with claim 1, where the aromatic iodonium salt is diphenyliodonium hexafluoroarsenate.

9. A cationically polymerizable composition in accordance with claim 1 having up to 100 parts of filler, per 100 parts of polymerizable organic material by weight.

* * * * *